US 6,703,172 B2

(12) United States Patent
Fujita et al.

(10) Patent No.: US 6,703,172 B2
(45) Date of Patent: Mar. 9, 2004

(54) PELLICLE AND PRODUCING METHOD OF MASK WITH PELLICLE

(75) Inventors: Minoru Fujita, Yamaguchi (JP); Hiroaki Nakagawa, Yamaguchi (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/284,364

(22) Filed: Oct. 31, 2002

(65) Prior Publication Data

US 2003/0096178 A1 May 22, 2003

(30) Foreign Application Priority Data

Oct. 31, 2001 (JP) ........................................ 2001-334312

(51) Int. Cl.[7] .............................................. G03F 9/00
(52) U.S. Cl. ................................ 430/5; 428/14; 355/75
(58) Field of Search .............................. 430/5; 428/14; 355/75

(56) References Cited

U.S. PATENT DOCUMENTS 5,616,927 A    4/1997   Kubota
6,337,161 B2 *  1/2002   Chiba et al. .................... 430/5
6,436,586 B1 *  8/2002   Matsuoka et al. ............. 430/5
6,443,302 B2 *  9/2002   Tanaka .................... 206/316.1

FOREIGN PATENT DOCUMENTS

JP            7-120931 A        5/1995

* cited by examiner

Primary Examiner—Mark F. Huff
Assistant Examiner—Saleha Mohamedulla
(74) Attorney, Agent, or Firm—Birch, Stewart, Kolasch & Birch, LLP

(57) ABSTRACT

A pellicle comprises a pellicle frame, a pellicle film and at least two liners. The pellicle frame has one end face and the other end face and is provided at its central portion with an opening. The other end face of the pellicle frame is provided with an adhesion layer. The pellicle film is stretched over and attached to the one end face of the pellicle frame. The at least two liners are adhered on the adhesion layer. The at least two liners can be respectively peeled off from the adhesion layer, and when the at least two liners are respectively peeled off from the adhesion layer, a portion of the adhesion layer to which each of the liners was adhered is exposed.

14 Claims, 4 Drawing Sheets

PELLICLE AND PRODUCING METHOD OF MASK WITH PELLICLE

This nonprovisional application claims priority under 35 U.S.C. §119(a) on Patent Application No. 2001-334312 filed in JAPAN on Oct. 31, 2001, which is herein incorporated by reference.

BACKGROUND OF THE INVENTION

1. Field of the Invention

The present invention relates to a pellicle and a producing method of a mask having a pellicle attached to a substrate such as the mask or a reticle (mask and reticle are generically called "mask", hereinafter).

2. Description of the Related Art

In a photolithography process, using a photomask or a reticle having a glass plate surface on which a circuit pattern is formed by a deposition film such as chromium, the circuit pattern is transferred, by means of exposure, onto a silicon wafer on which a resist is applied. In this process, if the exposure is performed in a state in which a foreign matter such as dust is attached to the circuit pattern on the mask, the foreign matter is transferred also onto the wafer, and a failed wafer is adversely produced. Especially when the exposure is performed by a stepper, a possibility that all chips formed on a wafer become failed chips is high, and the adhesion of foreign matters onto a wafer is a serious problem. Thereupon, a pellicle through which exposure light excellently passes is mounted to a mask, thereby preventing dust from attaching to the mask.

Usually, a mask is produced through the following five processes:

(1) a process for cleaning a mask;
(2) a process for inspecting the mask, i.e., for checking whether a circuit is formed as designed and whether a foreign matter is not attached to the mask;
(3) a process for adhering a pellicle to the mask;
(4) a process for inspecting the mask with the pellicle; and
(5) a process for shipping the mask.

Usually, in the process (2), it is inspected whether the mask is produced as designed and whether a foreign matter is not attached to the mask. Only accepted masks are brought into the process (3). Thereafter, in the process (4), a pellicle is adhered to the mask, and then it is inspected whether a failure is not generated in the mask and whether a foreign matter is not mixed. Only accepted masks are brought into the shipping process. The pellicles are peeled off from failed masks, and such masks are returned to the process (1), where the masks are reused. The pellicles are damaged in some cases at the time of the peeling-off operation and thus, they are discarded.

Although a computer system is used for the inspection, it is indispensable for people to inspect the masks by himself or herself eventually, and the similar inspections must be carried out as many as twice before shipment, which increases costs industrially. Further, from the failed masks with pellicles generated in the inspection of the process (4), the pellicles are peeled off and then, the masks are returned to the cleaning process (1), but since the pellicles can not be reused, there are realities that the pellicles must be discarded.

Japanese Patent Application Laid-open No. 7-120931 discloses that an adhesive whose adhesion force is weakened by heating and/or light irradiation is used as an adhesive for fixing a pellicle to a reticle, the pellicle is adhered to the reticle by this kind of adhesion layer, and if this adhesion layer is heated or irradiated with light, the adhesion force of the adhesion layer is weakened and thus, the pellicle can easily be peeled off from the reticle. According to this technique, however, in order to peel off the pellicle from the reticle, it is necessary to carry out an operation for changing an environment condition for the mask with the pellicle or the like.

SUMMARY OF THE INVENTION

Therefore, it is a main object of the present invention to provide a pellicle and a producing method of a mask with a pellicle, in which the number of inspections can be reduced, and the pellicle can be peeled off from a mask and reused after the pellicle is once attached to the mask.

According to a first aspect of the present invention, there is provided a pellicle, comprising:

a pellicle frame having one end face and the other end face and being provided at its central portion with an opening, the other end face of the pellicle frame being provided with an adhesion layer;

a pellicle film stretched over and attached to the one end face of the pellicle frame; and at least two liners adhered on the adhesion layer, wherein the at least two liners can be respectively peeled off from the adhesion layer, and when the at least two liners are respectively peeled off from the adhesion layer, a portion of the adhesion layer to which each of the liners was adhered is exposed.

According to a second aspect of the present invention, there is provided a producing method of a mask with a pellicle, comprising temporarily adhering a pellicle to a mask in a state in which the pellicle can be peeled off from the mask, the pellicle having a pellicle frame provided at its central portion with an opening, a pellicle film stretched over and attached to one end face of the pellicle frame, and an adhesion layer provided on the other end face of the pellicle frame, inspecting the mask in the temporarily adhered state, finally adhering the pellicle to the mask by the adhesion layer to produce the mask with the pellicle if the mask is accepted in the inspection, and peeling off the pellicle from the mask if the mask is not accepted in the inspection and reusing the pellicle to produce a mask with the pellicle.

According to a third aspect of the present invention, there is provided a producing method of a mask with a pellicle, comprising:

preparing a pellicle having a pellicle frame provided at its central portion with an opening, a pellicle film stretched over and attached to one end face of the pellicle frame, an adhesion layer provided on the other end face of the pellicle frame, and at least two liners adhered onto the adhesion layer, removing at least one of the at least two liners from the pellicle frame to expose a portion of the adhesion layer, and temporarily adhering the pellicle to a mask through the exposed adhesion layer, and removing at least one of the remaining liners or the remaining liner, thereby finally adhering the pellicle to the mask.

According to a fourth aspect of the present invention, there is provided a producing method of a mask with a pellicle, comprising:

preparing a pellicle having a pellicle frame provided at its central portion with an opening, a pellicle film stretched over and attached to one end surface of the pellicle frame, an adhesion layer provided on the other end face of the pellicle frame, and a main liner and a sub-liner laminated on each other such that a portion of the main liner is exposed from the sub-liner, the sub-liner being adhered directly to the adhesion layer, the main liner being also adhered directly to the adhesion layer at the portion of the main liner which is exposed from the sub-liner, the main liner and the sub-liner being capable of being peeled off from the adhesion layer separately, peeling off the main liner from the adhesion layer, and temporarily adhering the pellicle to a mask by the adhesion layer exposed from the sub-liner, and thereafter, peeling off the sub-liner from the adhesion layer in the temporarily adhered state, and finally adhering the pellicle to the mask by the adhesion layer.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Next, preferred embodiments of the present invention will be explained with reference to the drawings.

Figure 1A:
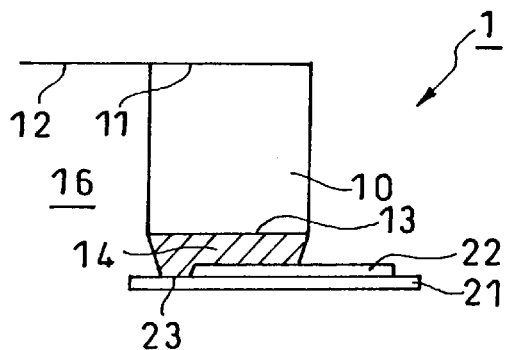
FIG. 1A is a schematic fragmentary longitudinal sectional view of a pellicle of one embodiment of the present invention.

As shown in FIGS. 1A, B and C, in a pellicle 1 of the present invention, a pellicle film 12 is stretched and provided on an end face 11 of a pellicle frame 10 such as to cover an opening 16 of the pellicle frame 10. The pellicle frame 10 used in the invention may be one which is usually used as a pellicle frame. Examples of the pellicle frame 10 are pellicle frames made of aluminum alloy, stainless, polyethylene and alumetized black aluminum. The entire surface of the pellicle frame may be coated with amorphous fluoropolymer or the like. Among them, pellicle frames made of aluminum alloy, black anodized aluminum and the like are preferable.

A thin film used as the pellicle film 12 may be one which is usually used as a pellicle film. Examples of the thin film used as the pellicle film 12 are films made of nitrocellulose, cellulose acetate, amorphous fluoropolymer and the like. The thin film is stretched on one 11 of end faces of the pellicle frame 10, thereby forming the pellicle film 12. The pellicle film 12 can be fixed to the pellicle frame 10 by a film adhesive for example.

The other end face 13 of the pellicle 1 of one embodiment of the present invention which is opposite from the end face 11 is provided with an adhesion layer 14. A liner formed by laminating a sub-liner 22 and a main liner 21 on each other is laminated on the adhesion layer 14 such that the main liner 21 comes on the opposite side from the sub-liner 22. That is, these elements are provided in the order of the pellicle film 12/the pellicle frame 10/the adhesion layer 14/the sub-liner 22/the main liner 21. The sub-liner 22 is smaller than the main liner 21, and a portion 23 of the main liner 21 is exposed from the sub-liner 22. The sub-liner 22 is adhered directly to the adhesion layer 14, and the main liner 21 is also adhered directly to the adhesion layer 14 at its portion 23 exposed from the sub-liner 22. The portion 23 exposed from the sub-liner 22 has such a shape that surrounds the opening 16 of the pellicle frame. A thickness of the main liner 21 is usually 50 to 300 $\mu$m, and preferably 50 to 150 $\mu$m. A thickness of the sub-liner 22 is usually 10 to 300 $\mu$m, and preferably 15 to 150 $\mu$m. The main liner 21 is provided with a tub 212, and the sub-liner 22 is provided with a tub 221 and a notch 222.

In the pellicle 1, the sub-liner 22 and the main liner 21 are laminated on each other and adhered to the adhesion layer 14 in the above-described manner. In order to produce a mask with a pellicle by adhering the pellicle 1 to the mask, the main liner 21 is peeled off from the adhesion layer 14 first, and the pellicle 1 is temporarily adhered to the mask by adhesion layer 14 exposed from the sub-liner 22. The inspection is carried out in the state in which the pellicle is temporarily adhered to the mask, and if the mask is acceptable, the sub-liner 22 is peeled off from the adhesion layer 14 in the temporarily adhering state, and the pellicle 1 is finally adhered to the mask by the adhesion layer 14. If the mask is rejected, the pellicle 1 is peeled off from the mask and then, the pellicle 1 is used for another mask, and the mask with the pellicle is produced.

With this method, unlike the conventional method, it is unnecessary to carry out the inspection of the mask twice, i.e., before and after the pellicle is adhered, and only the inspection after the pellicle is adhered suffices. Even when the mask is rejected in the inspection, the pellicle 1 can be peeled off from the mask and then, the pellicle 1 can be reused for another mask, and the mask with the pellicle can be produced.

Figure 4:
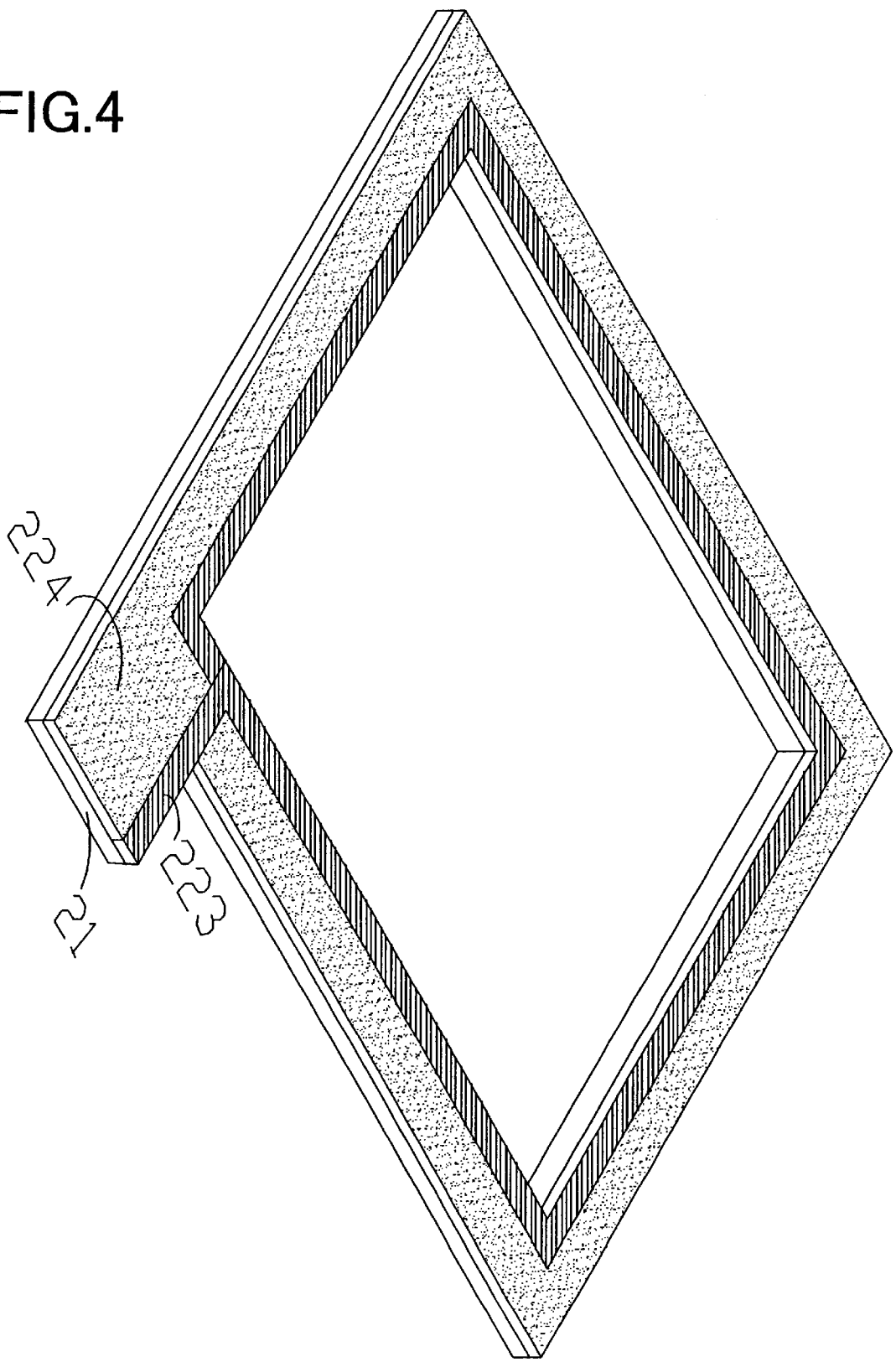
FIG. 4 is a schematic perspective view of a liner of a pellicle of another embodiment of the present invention.

Further, as shown in FIG. 4, the sub-liner may be divided into a sub-liner 223 and a sub-liner 224. In this case, after the main liner 21 is peeled off, a mask with a pellicle can be produced by the same operation as that described above. That is, the sub-liner 223 is peeled off, a pellicle is temporarily adhered to the mask by the exposed adhesion layer, the mask is inspected in the temporarily adhering state, and if the mask is acceptable, the sub-liner 224 is peeled off and the pellicle is finally adhered, thereby producing a mask with a pellicle.

The adhesion layer 14 is provided on the end face 13 of pellicle frame on the opposite side from the end face 11 on which the pellicle film 12 is stretched. The adhesion layer 14 may be means capable of fixing the pellicle 1 to the mask. For example, the adhesion layer 14 may be formed on the pellicle frame 10 by applying an adhesive material, or the adhesive material may be applied to a polyester film, and the film may be adhered to the pellicle frame 10 as an adhesive tape. It is preferable that the adhesive material includes synthetic resin ("base polymer", hereinafter) having cohesiveness. Preferable examples of the base polymer are ethylene vinyl acetate copolymer, butyl methacrylic resin, polystyrene, styrene-butylene copolymer, polyisobutylene and the like. The styrene-butylene copolymer is especially preferable.

When adhesive means made of an antistatic material is used, an adhesive material ("antistatic adhesive material", hereinafter) having an antistatic property may be used. For example, it is preferable that an antistatic agent is mixed into the adhesive material including the above-mentioned base polymer to form the antistatic adhesive material. As the antistatic agent to be mixed in the base polymer, a knead type antistatic agent which is suitably mixed in a polymer compound such as synthetic resin and the like. Concretely, preferable examples of the antistatic agent are carbon black, glyceric fatty acyl ester, polyoxy ethylene alkyl ether, polyoxy ethylene alkyl phenyl ether, N, N-bis (2-hydroxyethyl) alkyl amine, N-2-hydroxyethyl N-2-hydroxy alkyl amine, polyoxy ethylene alkyl amine, polyoxy ethylene alkyl amine fatty acyl ester, alkyl diethanolamine, alkyl sulfonate, alkyl benzene sulfonate, alkyl phosphate and the like.

Generally, a hydrophilic polymer has antistatic properties, and the hydrophilic polymer having antistatic properties is also included in the knead type antistatic agent. Some hydrophilic polymers have excellent persistence of antistatic effect. Examples of such hydrophilic polymers are polyethylene glycol based polymer and concretely, preferable examples of such hydrophilic polymer are polyethylene glycol, polyethylene glycol methacrylate copolymer, poly (ethylene oxidopropylene oxido) copolymer, polyethylene glycol based polyester amide, poly (epichlorohydrin.ethylene oxido) copolymer and the like.

Two or more kinds of knead type antistatic agents may be mixed, and a mixture of alkyl diethanolamine and glyceric fatty acyl ester and a mixture of alkyl benzene sulfonate and polyethylene glycol or higher alcohol can especially preferably be used as the knead type antistatic agent.

The knead type antistatic agent may be selected in accordance with kind of the base polymer and the like. A content of the knead type antistatic agent in the antistatic adhesive material is preferably 0.05 to 10% by weight, and more preferably 0.1 to 5% by weight.

First Embodiment

Figure 1B:
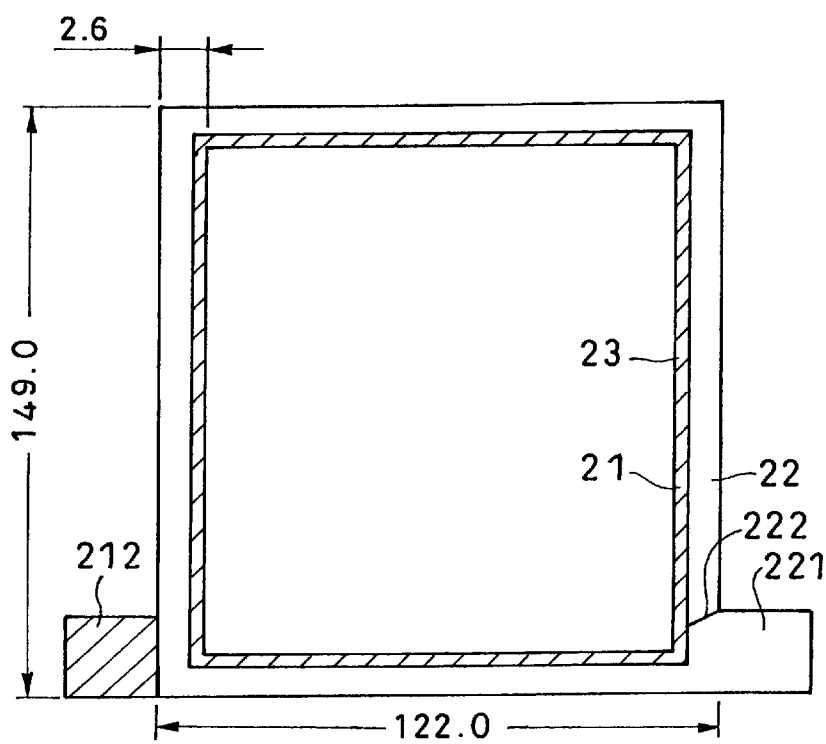
FIG. 1B is a schematic plan view of a liner of the pellicle of the one embodiment of the present invention.
Figure 1C:
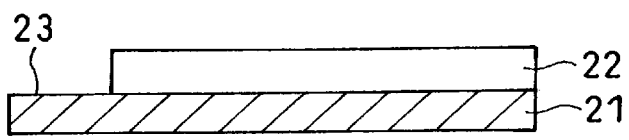
FIG. 1C is a schematic side view of the liner of the pellicle of the one embodiment of the present invention.

A main liner 21 made of PET resin having a thickness of 100 $\mu$m and a width of 2.6 mm, and a sub-liner 22 made of PET resin having a thickness of 25 $\mu$m and a width of 1.0 mm are bonded to each other to form a double-layered liner of 122×149 mm (see FIGS. 1B and 1C). Then, using an orthogonal robot (FR-A102X produced by Matsuhita Electric Industrial Co., Ltd.), an SEBS based adhesive (A131 produced by Asahi Kagaku Gousei) which was melted at 200° C. was applied to the end face 13 of the aluminum frame 10 having a height of 5.8 mm and a width of 2 mm, the formed double-layered liner was placed on the adhesion material 14 such that the sub-liner of the double-layered liner and the adhesion layer are opposed to each other. A plate having a temperature of 100 to 110° C. was pushed against the double-layered liner from above, and the liner was forcibly cooled by a cooling plate having a temperature of 25° C., and all of them was formed such that its height becomes 6.3 mm (see FIG. 1A).

Figure 2:
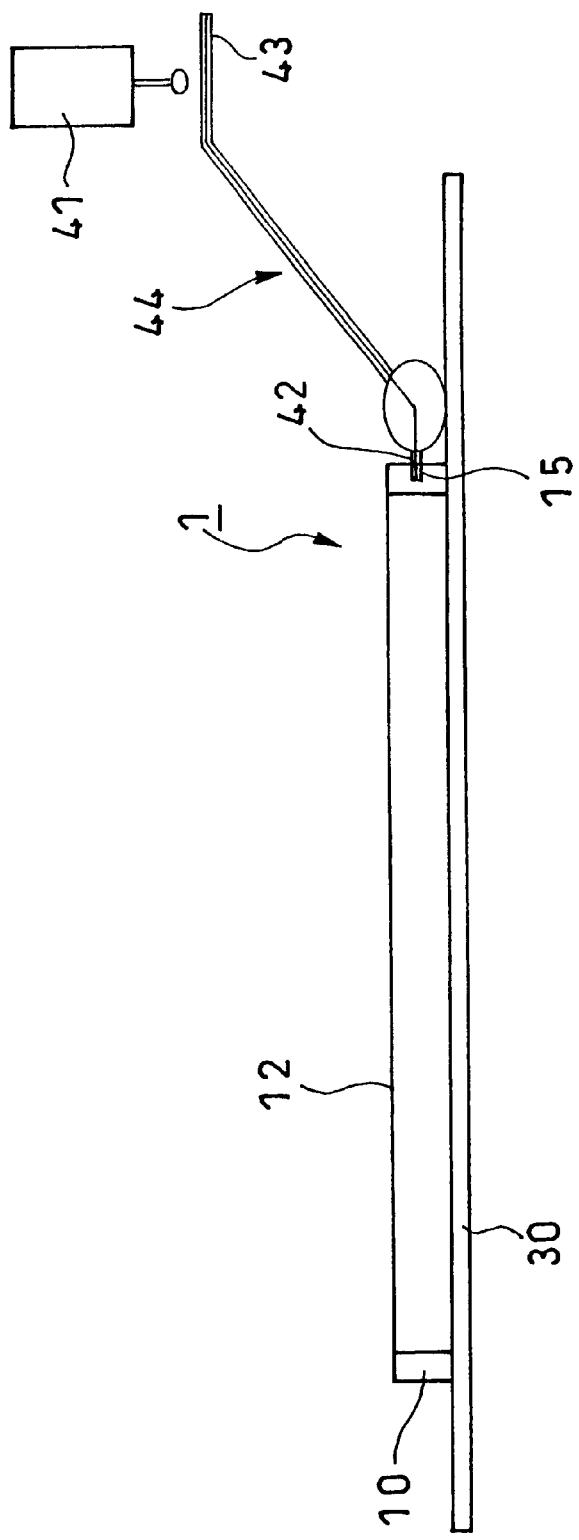
FIG. 2 is a schematic side view for explaining a measuring method of a peeling-off force for peeling off, from a mask, a pellicle of the one embodiment of the present invention and a conventional pellicle.

The operation was carried out in the following manner. That is, first, only the main liner 21 was peeled off by grasping the tub 212 (see FIG. 1B), and the pellicle 1 was adhered (temporarily adhered) to the mask with a force of 400 g for 30 seconds while limiting the exposed portion of the adhesive material in a state in which the sub-liner 22 was left on a surface of the adhesive material 14. An intimate contact width between the mask and the exposed portion of the pellicle adhesive material was 0.3 to 0.5 mm. Further, as shown in FIG. 2, one end 42 of a peeling jig 44 was inserted and mounted into a jig hole 15 of the pellicle 1, the other end 43 of the peeling jig 44 was pushed down at a speed of 50 mm/min, and the peeling-off force between the pellicle 1 and the mask 30 at that time was measured using a load cell 41 (BT-2L-B produced by Orientec). As a result, the peeling-off force was about 30 to 100 g. Five pellicles 1 were peeled off from masks 30, and in all of the five pellicles 1, a shape of the adhesive was not deformed and the pellicles could be peeled off without making the masks 30 dirty almost at all. The peeling-off force at that time was so enough that the pellicle could sufficiently be peeled off manually without using a peeling jig.

Second Embodiment

The pellicle 1 was adhered to the mask 30 in the same manner as that of the embodiment 1. A state (completely intimate contacted state) in which no air or the like is mixed in the mask over the entire periphery between the exposed adhesive and the mask was confirmed and then, the tub 221 (see FIG. 1B) of the sub-liner 22 was grasped, the sub-liner 22 was pulled out along an outer periphery of the aluminum frame at an angle of 30 to 60 (with respect to a liner peeling-off direction and at an angle of 10 to 20 (with respect to a surface of the mask. At that time, all of the five sub-liners 22 could be pulled out smoothly over the entire periphery without affecting the adhering state of the completely intimate contacted portion and without being caught on the adhesive. Thereafter, a load of 30 kg was applied to the entire periphery for three minutes, and a normal adhering operation (final adhering operation) of the pellicle was carried out. As a result, the same adhering state (entire periphery completely intimate contact state) as that of the current pellicle was confirmed.

Comparative Example

Figure 3A:
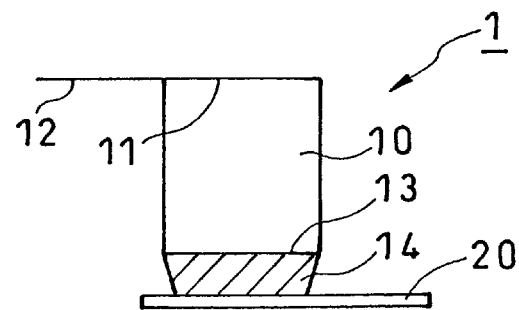
FIG. 3A is a schematic longitudinal sectional view of a conventional pellicle.
Figure 3B:
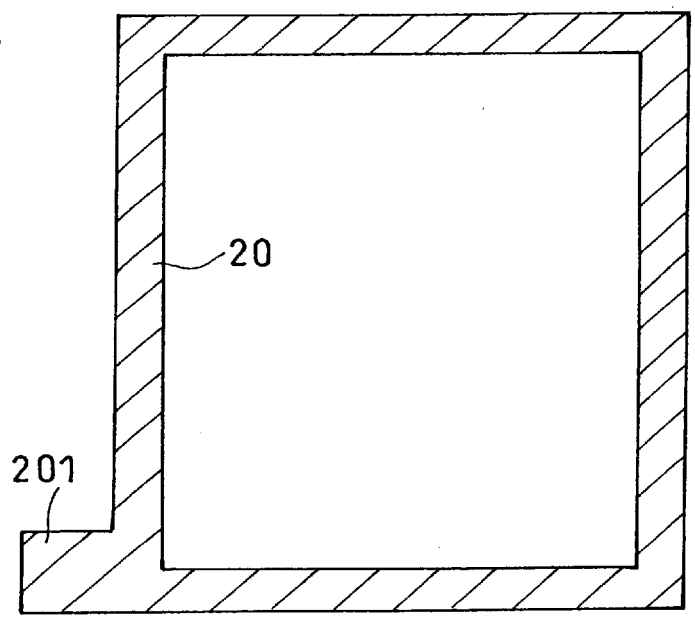
FIG. 3B is a schematic plan view of a liner of the conventional pellicle.
Figure 3C:
FIG. 3C is a schematic side view of the liner of the conventional pellicle.

As shown in FIGS. 3B and C, using a one-layered linear 20 having a thickness of 125 $\mu$m and a width of 2.6 mm, an SEBS based adhesive (A131 produced by Asahi Kagaku Gousei) was applied to an aluminum frame 10, and the liner 20 was adhered as in the same manner as that of the embodiment 1 except that the liner is different (see FIG. 3A). Next, the tub 201 (see FIG. 3B) of the liner 20 was grasped and peeled off, and was temporarily adhered, and the peeling-off force was measured. The intimate contact width between the mask and the exposed portion of the pellicle adhesive material was 0.8 to 0.9 mm, and the peeling-off force from the mask was as great as 250 g, which is 2.5 to 8.3 times greater as compared with a case in which the double-layered liner was used. The pellicle could not be peeled off from the mask without the peeling jig. Although an attempt was made to peel off the pellicle using the peeling jig, in all of the five pellicles, the adhesive at the peeling portion was elongated, its shape was deformed, and the pellicle could not be peeled off in a state in which the pellicle could be reused.

As described above, in the case of the one-layered liner, even if the pellicle was adhered temporarily, the intimate contact between the mask and the pellicle was strong, and it was difficult to peel off the pellicle neatly. When the double-layered liner having the sub-liner and the main liner is used, it was possible to temporarily adhere the adhesive material while limiting the exposed area, and to peel off the pellicle lightly, and the pellicle could be reused after it was peeled off.

When the pellicle of the embodiment of the present invention is used, the pellicle can be adhered in two steps, and if the pellicle is accepted, only the second liner can be peeled off in a state in which the pellicle and the mask are in intimate contact with each other. Therefore, the pellicle can finally be adhered without fear of mixing of foreign matter. Further, when the mask with the pellicle is not accepted in the inspection of foreign matter, both of them are peeled off from each other, and the mask and the pellicle can be reused. When they are accepted, only the first pellicle liner can be peeled off in a state in which the second liner and mask are in intimate contact with each other. Therefore, it is possible to finally adhere the pellicle without fear of mixing of foreign matter. Further, according to the pellicle of the present invention, the inspection of foreign matter for only the mask in unnecessary, and one inspection of foreign matter suffices in the producing process of a mask with a pellicle.

According to the present invention, there is provided a pellicle and a producing method of a mask with a pellicle, in which the number of inspections can be reduced, and the pellicle can be peeled off from a mask and reused after the pellicle is once attached to the mask.

The entire disclosure of Japanese Patent Application No. 2001-334312 filed on Oct. 31, 2001 including specification, claims, drawings and abstract is incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A pellicle, comprising:
   a pellicle frame having one end face and the other end face and being provided at its central portion with an opening, the other end face of said pellicle frame being provided with an adhesion layer;
   a pellicle film stretched over and attached to said one end face of said pellicle frame; and
   at least two liners adhered on said adhesion layer, wherein said at least two liners can be respectively peeled off from said adhesion layer, and when said at least two liners are respectively peeled off from said adhesion layer, a portion of said adhesion layer to which each of said liners was adhered is exposed.

2. A pellicle as recited in claim 1, wherein said at least two liners have a laminated structure that a portion of one of said at least two liners is exposed from another or the other liner of said at least two liners which is nearer to said adhesion layer than said one of said at least two liners, the liner which is the nearest to said adhesion layer is adhered directly to said adhesion layer, the liner which is further from said adhesion layer than said liner which is the nearest to said adhesion layer is also adhered directly to said adhesion layer at said exposed portion.

3. A pellicle as recited in claim 2, wherein said at least two liners comprises a main liner and a sub-liner, a portion of said main liner is exposed from said sub-liner, the sub-liner is adhered directly to said adhesion layer, said main liner is also adhered directly to said adhesion layer at said portion exposed from said sub-liner, and said main liner and said sub-liner can be respectively peeled off from said adhesion layer.

4. A pellicle as recited in claim 2, wherein said exposed portion of said one liner which is further from said adhesion layer than said another or said the other liner has a shape which surrounds said opening.

5. A pellicle as recited in claim 2, wherein said at least two liners have different sizes from each other.

6. A pellicle as recited in claim 2, wherein the sizes of said at least two laminated liners are reduced in succession as they are closer to said adhesion layer.

7. A producing method of a mask with a pellicle, comprising
   temporarily adhering a pellicle to a mask in a state in which said pellicle can be peeled off from said mask, said pellicle having a pellicle frame provided at its central portion with an opening, a pellicle film stretched over and attached to one end face of said pellicle frame, and an adhesion layer provided on the other end face of said pellicle frame,
   inspecting said mask in said temporarily adhered state,
   finally adhering said pellicle to said mask by said adhesion layer to produce the mask with the pellicle if said mask is accepted in said inspection, and peeling off said pellicle from said mask if said mask is not accepted in the inspection and reusing said pellicle to produce a mask with the pellicle.

8. A producing method of a mask with a pellicle, comprising:
   preparing a pellicle having a pellicle frame provided at its central portion with an opening, a pellicle film stretched over and attached to one end face of said pellicle frame, an adhesion layer provided on the other end face of said pellicle frame, and at least two liners adhered onto said adhesion layer,
   removing at least one of said at least two liners from said pellicle frame to expose a portion of said adhesion layer, and temporarily adhering said pellicle to a mask through said exposed adhesion layer, and
   removing at least one of the remaining liners or the remaining liner, thereby finally adhering said pellicle to said mask.

9. A producing method of a mask with a pellicle as cited in claim 8, wherein
   one of said at least two liners is removed from said pellicle frame to expose a portion of said adhesion layer and said pellicle is temporarily adhered to said mask through said exposed adhesion layer, and
   all remaining liners are removed, thereby finally adhering said pellicle to said mask.

10. A producing method of a mask with a pellicle as cited in claim 8, wherein
    said mask is inspected in said temporarily adhered state, if said mask is accepted in the inspection, said pellicle is finally adhered to said mask to produce the mask with the pellicle, and if said mask is not accepted in the inspection, said pellicle is peeled off from said mask and then, said pellicle is used for another mask to produce a mask with a pellicle.

11. A producing method of a mask with a pellicle as cited in claim 8, wherein said portion of said adhesion layer which has been exposed before said temporary adhering has a shape which surrounds said opening.

12. A producing method of a mask with a pellicle, comprising:
    preparing a pellicle having a pellicle frame provided at its central portion with an opening, a pellicle film stretched over and attached to one end face of said pellicle frame, an adhesion layer provided on the other end face of said pellicle frame, and a main liner and a sub-liner laminated on each other such that a portion of said main liner is exposed from said sub-liner, said sub-liner being adhered directly to said adhesion layer, said main liner being also adhered directly to said adhesion layer at said portion of said main liner which is exposed from said sub-liner, said main liner and said sub-liner being capable of being peeled off from said adhesion layer separately, peeling off said main liner from said adhesion layer, and temporarily adhering said pellicle to a mask by said adhesion layer exposed from said sub-liner, and thereafter, peeling off said sub-liner from said adhesion layer in said temporarily adhered state, and finally adhering said pellicle to said mask by said adhesion layer.

13. A producing method of a mask with a pellicle as recited in claim 12, wherein said mask is inspected in said temporarily adhered state, if said mask is accepted in the inspection, said sub-liner is peeled off from said adhesion layer and said pellicle is adhered to said mask by said adhesion layer to produce the mask with the pellicle, and if said mask is not accepted in the inspection, said pellicle is peeled off from said mask and then, said pellicle is used for another mask to produce a mask with a pellicle.

14. A producing method of a mask with a pellicle as recited in claim 12, wherein said portion of said main liner which is exposed from said sub-liner has a shape which surrounds said opening.

\* \* \* \* \*